(12) United States Patent
Stoyan et al.

(10) Patent No.: US 7,868,339 B2
(45) Date of Patent: Jan. 11, 2011

(54) ILLUMINATING DEVICE

(75) Inventors: Harald Stoyan, Regensburg (DE);
Markus Hofmann, Bad Abbach (DE);
Alexander Wilm, Regensburg (DE);
Michael Sailer, Wolfskofen (DE);
Rainer Huber, Laberweinting (DE);
Monika Rose, Munich (DE)

(73) Assignee: Osram Gesellschaft mit beschränkter Haftung, München (DE)

( * ) Notice: Subject to any disclaimer, the term of this patent is extended or adjusted under 35 U.S.C. 154(b) by 533 days.

(21) Appl. No.: 11/985,946

(22) Filed: Nov. 19, 2007

(65) Prior Publication Data
US 2008/0135865 A1 Jun. 12, 2008

(30) Foreign Application Priority Data
Nov. 17, 2006 (DE) .................. 20 2006 017 583 U

(51) Int. Cl.
*H01L 33/00* (2010.01)
(52) U.S. Cl. .................... 257/98; 362/311.02
(58) Field of Classification Search ............ 362/311.01, 362/311.02, 311.04; 257/98, E31.127
See application file for complete search history.

(56) References Cited

U.S. PATENT DOCUMENTS

| 6,498,355 | B1 | 12/2002 | Harrah et al. |
| 6,550,982 | B2 | 4/2003 | Auburger et al. |
| 6,828,590 | B2 * | 12/2004 | Hsiung .................. 257/79 |
| 7,058,250 | B2 | 6/2006 | Bachl et al. |
| 2004/0164311 | A1 | 8/2004 | Uemura |

FOREIGN PATENT DOCUMENTS

| DE | 202004012322 U1 | 10/2004 |
| EP | 1174745 A1 | 1/2002 |
| EP | 1524705 A2 | 4/2005 |
| JP | 2002093206 A | 3/2002 |

* cited by examiner

*Primary Examiner*—John A Ward
(74) *Attorney, Agent, or Firm*—Cohen Pontani Lieberman & Pavane LLP

(57) ABSTRACT

An illumination device comprising a connection carrier (1), at least one light-emitting diode (10), an electrically insulating layer (3) and a fixing device (4) is specified. The connection carrier (1) has a first main area (1a) and a second main area (1b) remote from the first main area. The light-emitting diode (10) is fixed on the first main area (1a) of the connection carrier (1). The electrically insulating layer (3) is fitted to the second main area (1b) of the connection carrier (1) and projects laterally beyond the second main area (1b) of the connection carrier (1). The fixing device (4) is suitable for fixing the illumination device to a mounting area (2a) of a carrier (2), wherein the electrically insulating layer (3) is arranged between the second main area (1b) of the connection carrier (1) and the mounting area (2a) of the carrier (2). Furthermore, the fixing device (4) presses the connection carrier (1) against the mounting area (2a). The pressure exerted in this way is used to effect a fixing of the insulating layer (3) between the second main area (1b) of the connection carrier (1) and the mounting area (2a). The fixing device (4) is connected to an optical element (8), which optically influences the light generated by the light-emitting diode (10) during operation.

15 Claims, 1 Drawing Sheet

ILLUMINATING DEVICE

RELATED APPLICATION

This patent application claims the priority of German Utility Model Application 20 2006 017 583.0 filed Nov. 17, 2006, the disclosure content of which is hereby incorporated by reference.

FIELD OF THE INVENTION

The present invention is related to an illumination device that includes a light-emitting diode fixed on a connection carrier.

BACKGROUND OF THE INVENTION

The document U.S. Pat. No. 7,058,250 describes an illumination device.

SUMMARY OF THE INVENTION

One object of the invention is to provide an illumination device which is simpler to produce and in which the coupling to an optical element can be brought about in a simple manner.

In accordance with at least one embodiment of the illumination device, the illumination device comprises a connection carrier. The connection carrier has a first main area and a second main area remote from the first main area. The connection carrier is for example a printed circuit board having contact locations and conductor tracks. The connection carrier is preferably a metal-core circuit board or a so-called insulated metal substrate.

In accordance with at least one embodiment of the illumination device, at least one light-emitting diode is fixed on the first main area of the connection carrier. The light-emitting diode is suitable for generating light during operation, and forms the luminous means of the illumination device. The light-emitting diode can be electrically conductively connected for example to contact locations of the connection carrier. Electrically conductive contact is made with the light-emitting diode via the connection carrier.

In accordance with at least one embodiment of the illumination device, the illumination device comprises an electrically insulating layer, which is fitted to the second main area of the connection carrier. In this case, the electrically insulating layer can be in direct contact with the second main area of the connection carrier. Furthermore, it is possible for further components such as a heat sink, for example, to be arranged between the second main area of the connection carrier and the electrically insulating layer.

The electrically insulating layer projects laterally beyond the second main area of the connection carrier. That is to say that the electrically insulating layer projects, at the edge of the connection carrier, beyond the lateral boundary of the second main area of the connection carrier by a certain amount. The electrically insulating layer is preferably distinguished by a low thermal resistance, such that heat generated during operation of the light-emitting diode can be dissipated to the surroundings via the electrically insulating layer.

In accordance with at least one embodiment of the illumination device, the illumination device comprises a connection carrier, which has a first main area and a second main area remote from the first main area. Furthermore, the illumination device comprises at least one light-emitting diode fixed on the first main area of the connection carrier, and an electrically insulating layer, which is fitted to the second main area of the connection carrier and projects laterally beyond the second main area of the connection carrier.

In accordance with at least one embodiment of the illumination device, the illumination device comprises a fixing means suitable for fixing the illumination device to a mounting area, wherein the electrically insulating layer is arranged between the second main area of the connection carrier and the mounting area. The mounting area is formed for example by a main area of a carrier on which the illumination device is applied and to which the illumination device is fixed by the fixing means.

In accordance with at least one embodiment of the illumination device, the fixing means is embodied in such a way that it presses the connection carrier against the mounting area. By way of example, the fixing means can in this case be embodied as a screw or clamping frame.

The pressure exerted by the fixing means is used to bring about a fixing of the insulating layer between the second main area of the connection carrier and the mounting area. By way of example, the electrically insulating layer is an electrically insulating foil or an electrically insulating plate.

The electrically insulating layer is introduced for example loosely between the second main area of the connection carrier and the mounting area and pressed onto the mounting area by means of the pressure exerted on the connection carrier by the fixing means, such that the electrically insulating layer is fixed firmly between connection carrier and mounting area. Adhesively bonding the insulating layer onto the connection carrier and/or the mounting area can be dispensed with in this way.

In accordance with at least one embodiment of the illumination device, the fixing means is connected to an optical element, which optically influences the light generated by the light-emitting diode during operation. By way of example, the optical element and the fixing means can be formed integrally with one another. The optical element can be for example a lens, an optical concentrator or a reflective optical element which contributes to the beam shaping of the light emitted by the light-emitting diode during operation.

In accordance with at least one embodiment of the illumination device, the electrically insulating layer projects beyond to an extent such that a sufficient electrical insulation is complied with. That is to say that the electrically insulating layer projects beyond the second main area of the connection carrier by a specific amount that ensures a sufficient electrical insulation. Preferably, the electrically insulating layer projects beyond the second main area by at least said amount at every location of the edge of the connection carrier. In this case, the illumination device makes use of the idea, inter alia, that a projecting electrically insulating layer increases the creepage path of the illumination device and thus ensures reliable operation of the illumination device. A sufficient electrical insulation is understood to mean for example an electrical insulation which satisfies IEC standard 60598-1.

In accordance with at least one embodiment of the illumination device, the electrically insulating layer is embodied as a thermally conductive foil. For this purpose, the electrically insulating layer is formed for example from a plastic foil composed of an electrically insulating plastic having good thermal conductivity.

In accordance with at least one embodiment, the electrically insulating layer is embodied as an insulating plate. Such an insulating plate has an increased mechanical strength compared with a foil. The insulating plate is embodied for example in rigid rather than flexible fashion. The electrically insulating layer can be formed for example from a plastic having good thermal conductivity.

In accordance with at least one embodiment of the illumination device, the electrically insulating layer is formed by an electrically insulating adhesive comprising spacer particles. The spacer particles ensure that the electrically insulating adhesive has a certain thickness. By way of example, the spacer particles are spherules formed from an electrically insulating material—for example from a plastic. The spacer particles are either dispersed in the adhesive as early as during the application of said adhesive or are dispersed into the adhesive subsequently—that is to say after the application of the adhesive.

In accordance with at least one embodiment of the illumination device, the fixing means has contact locations which make electrical contact with the connection carrier. That is to say that conductor tracks for making electrical contact with the connection carrier can be fixed in or to the fixing means and connect the contact locations via which electrical contact is to be made with the connection carrier to further illumination devices of identical type and/or a current or voltage source.

In accordance with at least one embodiment of the illumination device, the fixing means imparts an electrical contact between the illumination device and at least one further illumination device of identical type. That is to say that preferably adjacent illumination devices of identical type are electrically conductively connected to one another by means of the fixing means. A plurality of illumination devices can be connected in series or in parallel with one another in this way.

In accordance with at least one embodiment of the illumination device, the insulating layer has at least one perforation into which the fixing means is introduced. The fixing means can in this case be a screw which reaches into a carrier through the connection carrier and the perforation in the insulating layer and mechanically connects the illumination device to the carrier.

The illumination device described here is explained in more detail below on the basis of exemplary embodiments and the associated figures.

DETAILED DESCRIPTION OF THE DRAWINGS

In the exemplary embodiments and figures, identical or identically acting component parts are in each case provided with the same reference symbols. The elements illustrated should not be regarded as true to scale; rather, individual elements may be illustrated with an exaggerated size in order to afford a better understanding.

Figure 1:
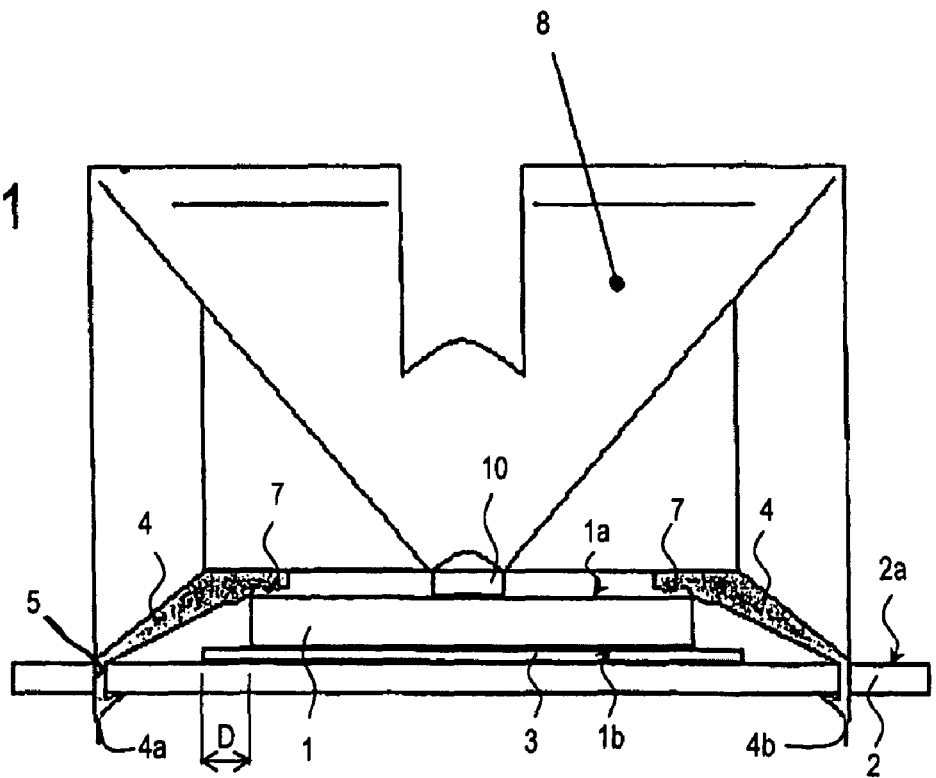
FIG. 1 shows a first exemplary embodiment of an illumination device described here in a schematic sectional illustration.

FIG. 1 shows a first exemplary embodiment of an illumination device described here on the basis of a schematic sectional illustration. The illumination device comprises at least one light-emitting diode 10, as luminous means, and a connection carrier 1. The light-emitting diode 10 is mounted onto first main area 1a of the connection carrier 1. The connection carrier 1 is formed by an IMS substrate (IMS= insulated metal substrate). An electrically insulating layer 3 is arranged between the second main area 1b of the connection carrier 1 and the mounting area 2a of a carrier 2. Carrier 2 functions as a mounting carrier for one or more illumination devices.

The insulating layer 3 is a thermally conductive foil composed for example of a plastic. At the edge of the connection carrier 1, the electrically insulating layer 3 projects beyond the connection carrier by the amount D. In this way, the creepage path (see below) is enlarged by the amount D by comparison with the connection carrier 1. In the exemplary embodiment of FIG. 1, the insulating layer 3 projects uniformly beyond the edge of the connection carrier 1 by at least 0.8 mm, for example by the amount D=0.9 mm. As a result, a sufficient electrical insulation is ensured in this exemplary embodiment. By way of example, connection carrier 1 and insulating layer 3 are formed in a rectangular fashion for this purpose, the insulating layer 3 having a larger basic area than the connection carrier 1.

The term "creepage path" means in this case the distance between the connection carrier 1 and the carrier 2 along the surface of the insulating layer 3 (see e.g. FIG. 1). If the insulating layer 3 would have the same lateral extension as the connection carrier 2, the "creepage path" would only have the amount of the thickness of the insulating layer 3. Because of the enlarged insulating layer 3 by the amount D, there is also an enlargement in the "creepage path" by the amount D. This is because the distance between the connection carrier 1 and the carrier 2 along the surface of the insulating layer 3 is enlarged by the amount D. That means that in this case the "creepage path" has the amount of the thickness of the insulating layer 3 plus the amount D.

The connection carrier 1 is mechanically connected to the carrier 2 by means of a fixing means 4, which is embodied as an electrically insulating clamping frame. In this case, the fixing means 4 is embodied such that it presses the connection carrier 1 against the carrier 2. The insulating layer 3 arranged between connection carrier 1 and carrier 2 is also fixed mechanically in this way.

In order to be able to exert the pressure on the connection carrier 1, the fixing means 4 embodied as a clamping frame is provided with snap-action hooks which are pressed through holes 5 in the carrier 2 and hook on the rear side of the carrier 2. The snap-action hooks have connection locations 4a, 4b at their tips. The clamping frame is preferably designed and constructed in such a way that it automatically centers the connection carrier 1 within the clamping frame.

In this exemplary embodiment, the fixing means 4 is provided with contacts 7 suitable for making electrical contact with the light-emitting diode 10 via the connection carrier 1. In this case, the contacts 7 can also be embodied in such a way that adjacent illumination devices are directly electrically interconnected with the aid of the fixing means 4. Electrical contact can be made with the contacts 7 via connection locations 4a, 4b of the fixing means 4.

Furthermore, an optical element 8 is fitted to the fixing means 4 embodied as a clamping frame. In this case, clamping frame and optical element can be formed integrally. The optical element 8 is for example a reflective optical element that forms a reflector for the electromagnetic radiation generated in the light-emitting diode 10 during operation. Furthermore, the light exit area of the optical element 8 can be formed in lenslike fashion.

Figure 2:
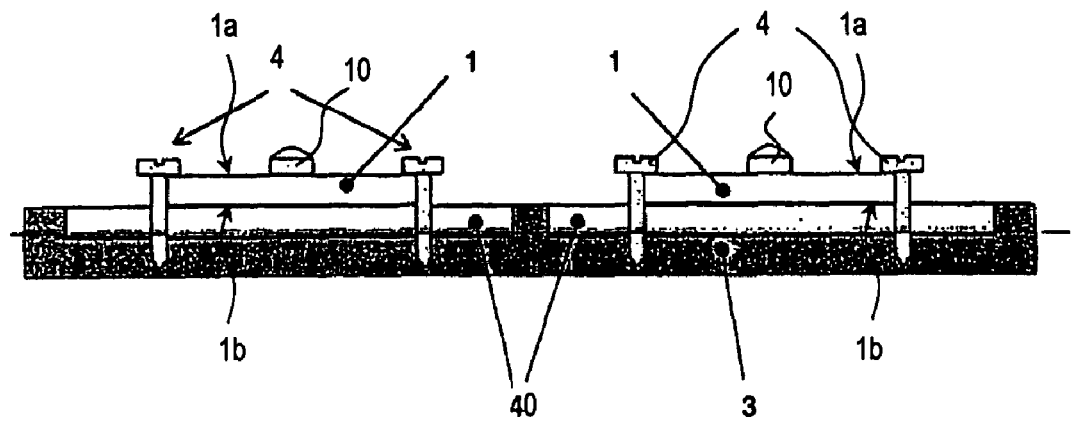
FIG. 2 shows a second exemplary embodiment of an illumination device described here in a schematic sectional illustration.

FIG. 2 shows a second exemplary embodiment of an illumination device described here in a schematic sectional illustration. In this exemplary embodiment, the connection carrier 1 is held in a frame by means of fixing means 4 embodied as screws, said frame functioning as carrier 2 and insulating layer 3. Arranged between the connection carrier 1 and the insulating layer 3 is a heat sink 40, which serves as a heat spreader and which distributes heat generated in the light-emitting diode chip 10 during operation over a large area over the insulating layer 3. The insulating layer 3 embodied as an electrically insulating frame is formed in such a way that the creepage path between two adjacent illumination devices is increased.

Furthermore, an optical element can be arranged at the fixing means 4, which optical element optically influences the light generated by the light-emitting diode 10 during operation (not illustrated).

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

We claim:

1. An illumination device, comprising:
    a connection carrier, which has a first main area and a second main area remote from the first main area,
    at least one light-emitting diode fixed on the first main area of the connection carrier,
    an electrically insulating layer, which is fitted to the second main area of the connection carrier and projects laterally beyond the second main area of the connection carrier, and
    a fixing means suitable for fixing the illumination device to a mounting area of a support carrier,
    wherein the electrically insulating layer is arranged between the second main area of the connection carrier and the mounting area of the support carrier,
    wherein the fixing means presses the connection carrier against the mounting area of the support carrier and the pressure exerted in this way is used to effect a fixing of the electrically insulating layer between the second main area of the connection carrier and the mounting area of the support carrier, and
    wherein the fixing means is connected to an optical element, which optically influences the light generated by the light-emitting diode during operation.

2. The illumination device according to claim 1, in which the electrically insulating layer projects beyond the second main area of the connection carrier to an extent such that a sufficient electrical insulation is complied with.

3. The illumination device according to claim 1, in which the electrically insulating layer comprises a thermally conductive foil.

4. The illumination device according to claim 1, in which the electrically insulating layer comprises an electrically insulating plate.

5. The illumination device according to claim 1, in which the electrically insulating layer comprises an electrically insulating adhesive containing spacer particles.

6. The illumination device according to claim 1, in which the fixing means comprises contact locations which make electrical contact with the connection carrier.

7. The illumination device according to claim 1, in which the fixing means includes an electrical contact between the illumination device and at least one further illumination device of identical type.

8. The illumination device according to claim 1, in which the electrically insulating layer comprises at least one perforation into which the fixing means is introduced.

9. The illumination device according to claim 1, in which the connection carrier is at least one of a metal-core circuit board and an insulated metal substrate.

10. The illumination device according to claim 1, further comprising a heat sink arranged between the second main area of the connection carrier and the electrically insulating layer.

11. The illumination device according to claim 1, in which the fixing means comprises at least one of a screw and a clamping frame.

12. The illumination device according to claim 1, in which the optical element and the fixing means are formed integrally with one another.

13. The illumination device according to claim 1, in which the fixing means comprises an electrically insulating clamping frame.

14. The illumination device according to claim 6, further comprising conductor tracks for making electrical contact with the connection carrier, wherein the conductor tracks are fixed at least one of in and to the fixing means.

15. The illumination device according to claim 7, further comprising conductor tracks for making electrical contact with the connection carrier, wherein the conductor tracks are fixed at least one of in and to the fixing means.

* * * * *